US010446663B2

(12) United States Patent
Yin et al.

(10) Patent No.: US 10,446,663 B2
(45) Date of Patent: Oct. 15, 2019

(54) SEMICONDUCTOR DEVICE

(71) Applicant: UNITED MICROELECTRONICS CORP., Hsin-Chu (TW)

(72) Inventors: Tan-Ya Yin, Nantou County (TW); Chia-Wei Huang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/121,567

(22) Filed: Sep. 4, 2018

(65) Prior Publication Data

US 2019/0013394 A1   Jan. 10, 2019

Related U.S. Application Data

(63) Continuation of application No. 15/618,141, filed on Jun. 9, 2017, now Pat. No. 10,109,720.

(30) Foreign Application Priority Data

Apr. 24, 2017  (TW) .............................. 106113554 A

(51) Int. Cl.
| H01L 31/119 | (2006.01) |
| H01L 29/66 | (2006.01) |
| H01L 29/78 | (2006.01) |
| H01L 29/423 | (2006.01) |
| H01L 21/308 | (2006.01) |
| H01L 29/06 | (2006.01) |

(52) U.S. Cl.
CPC .... *H01L 29/66545* (2013.01); *H01L 21/3085* (2013.01); *H01L 29/4238* (2013.01); *H01L 29/66795* (2013.01); *H01L 29/785* (2013.01); *H01L 29/0692* (2013.01)

(58) Field of Classification Search
CPC .............. H01L 29/0692; H01L 29/785; H01L 29/7851; H01L 21/823431; H01L 27/0886; H01L 27/1211; H01L 29/42384; H01L 29/66545; H01L 29/66795
See application file for complete search history.

(56) References Cited

U.S. PATENT DOCUMENTS

| 9,196,543 B2 | 11/2015 | Liaw |
| 9,899,267 B1* | 2/2018 | Liou ................. H01L 21/82387 |
| 2010/0287518 A1 | 11/2010 | Becker |
| 2012/0126326 A1 | 5/2012 | Wang |
| 2016/0322475 A1 | 11/2016 | Leobandung |

* cited by examiner

*Primary Examiner* — Hsien Ming Lee
(74) *Attorney, Agent, or Firm* — Winston Hsu

(57) ABSTRACT

A semiconductor device is provided. The semiconductor device includes a substrate and a patterned metal gate layer. The substrate includes a first fin segment and a second fin segment respectively protruding from a top surface of the substrate. The first fin segment and the second fin segment respectively extend along a first direction and are arranged along a second direction, the first fin segment comprises a first fin structure at an end of the first fin segment, and the second fin segment comprises a first recess at an end of the second fin segment, and the first recess and the first fin structure are arranged along the second direction. The patterned metal gate layer is disposed on the substrate, and the patterned metal gate layer covers the first fin structure.

11 Claims, 9 Drawing Sheets

SEMICONDUCTOR DEVICE

CROSS REFERENCE TO RELATED APPLICATIONS

This application is a continuation application of U.S. patent application Ser. No. 15/618,141 filed on Jun. 9, 2017, the entire contents of which are incorporated herein by reference.

BACKGROUND OF THE INVENTION

1. Field of the Invention

The present invention relates to a semiconductor device, and more particularly to a semiconductor device which relative position between a metal gate and an end of a fin structure can be inspected.

2. Description of the Prior Art

With the size of the transistors scaling down, development of the conventional planar transistor has been restricted in processes. Accordingly, it has become a main trend to replace the planar transistors with the non-planar transistor device, such as fin field effect transistor (FinFET) device, to overcome process limits.

In the manufacturing method of the conventional fin field effect transistor device, fin lines need to be formed in semiconductor substrate prior. Then, required fin structures would be formed by cutting the fin lines, so as to be sources, drains and channel areas of the transistor devices. However, a space existing between some of the fin structures formed by cutting the fin lines would be as high as 70 nanometers (nm), or microns even. The space is beyond the detecting range of scanning electrode microscope (SEM), such that this space would not be measured immediately. After cutting the fin structures, ends of the fin structures would be covered by dummy gate, and therefore, when the deviation of the space is generated in cutting, the dummy gate is not easy to cover the ends of the fin structures, such that the formed transistor device would not function normally. Although the space described above can be measured through transmission electron microscope, the transmission electron microscope consumes time and costs very much, so as to complicate the manufacturing process and increase the manufacturing cost.

SUMMARY OF THE INVENTION

It is one of the objectives of the present invention to provide a semiconductor device and a manufacturing method thereof, so as to detect a process of cutting a fin line and decrease a manufacturing cost.

An embodiment of the present invention provides a semiconductor device including a first fin structure, a second fin structure, a third fin structure, a patterned metal gate layer, and a first epitaxial layer. The first fin structure, the second fin structure, the third fin structure respectively protrude from a top surface of a substrate, wherein the first fin structure, the second fin structure and the third fin structure respectively extend along a first direction, the third fin structure and the first fin structure are aligned along the first direction, and the second fin structure and the third fin structure are arranged along a second direction, and wherein the first fin structure has a first end. The patterned metal gate layer is disposed on the substrate, wherein the patterned metal gate layer covers the first end of the first fin structure. The first epitaxial layer is disposed at a side of the second fin structure, the second fin structure and the first epitaxial layer are arranged along the first direction, and the first epitaxial layer and the first fin structure are arranged along the second direction, wherein the first epitaxial layer has a second end, and the first end and the second end facing the first direction.

Another embodiment of the present invention provides a manufacturing method of the semiconductor device including the following steps. Firstly, a first fin line and a second fin line respectively protruding from a top surface of the substrate are provided, wherein the first fin line and the second fin line respectively extend along a first direction, and the first fin line and the second fin line are arranged along a second direction. A fin line cutting process is performed for cutting the first fin line and the second fin line, so as to form a first fin segment and a second fin segment, wherein the first fin segment has a first end, the second fin segment has a second end, and the first end and the second end face the first direction. A patterned conductive layer is formed on the substrate, wherein the patterned conductive layer covers the first end of the first fin segment, and the patterned conductive layer does not cover the second end of the second fin segment.

In the manufacturing method of the semiconductor device of the present invention, through exposing the end of one of the fin segments after forming the patterned conductive layer, the relation between a cutting opening utilized for defining this end and a mask pattern formed by a first photolithography etching process utilized for defining the position of the second dummy gate can be detected, such that the probability of manufacturing defective semiconductor devices can be decreased, so as to decrease the manufacturing cost.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
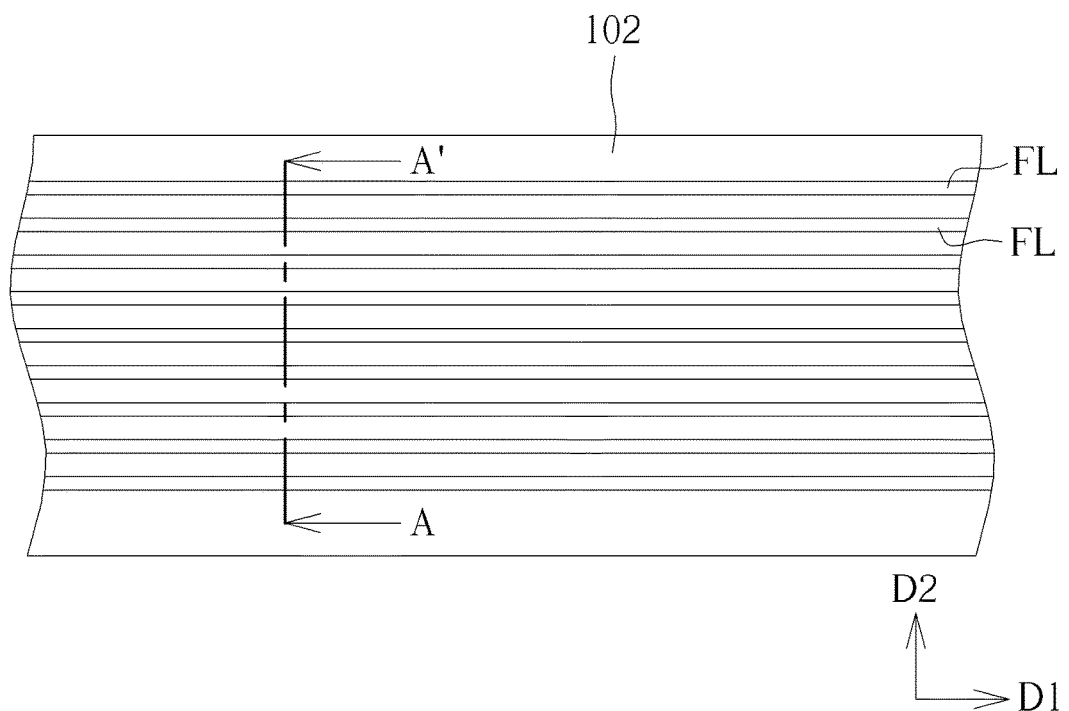
FIG. 1 to FIG. 15 are schematic drawings of a manufacturing method of a semiconductor device according to an embodiment of the present invention.
Figure 2:
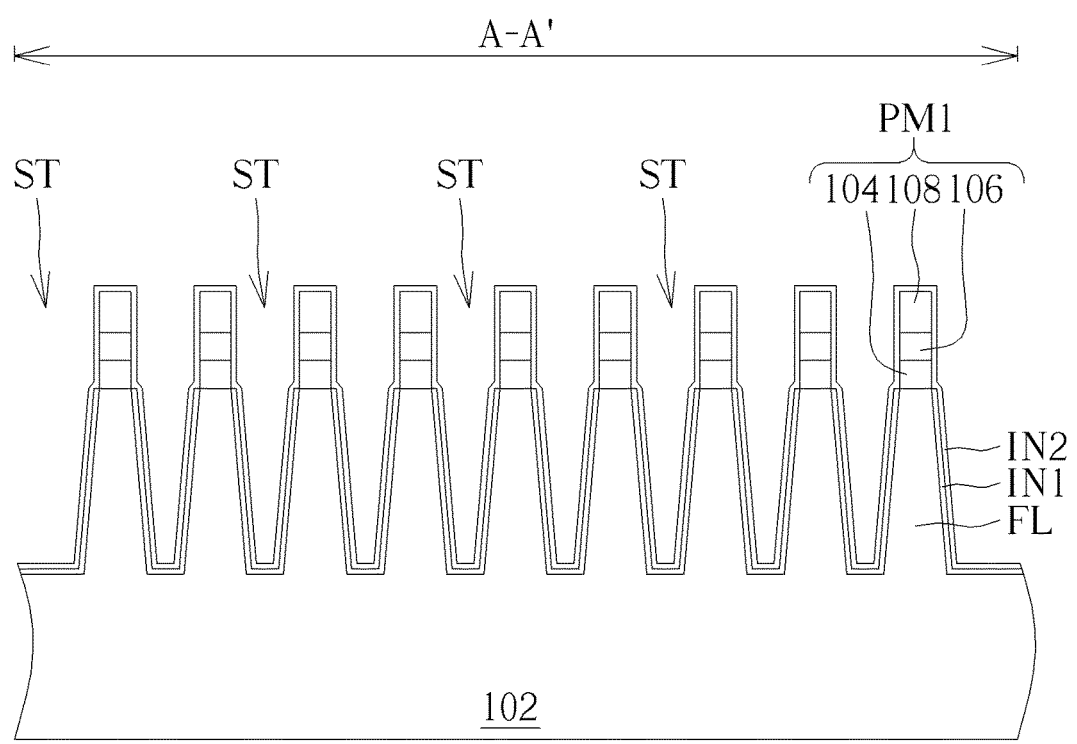
Figure 4:
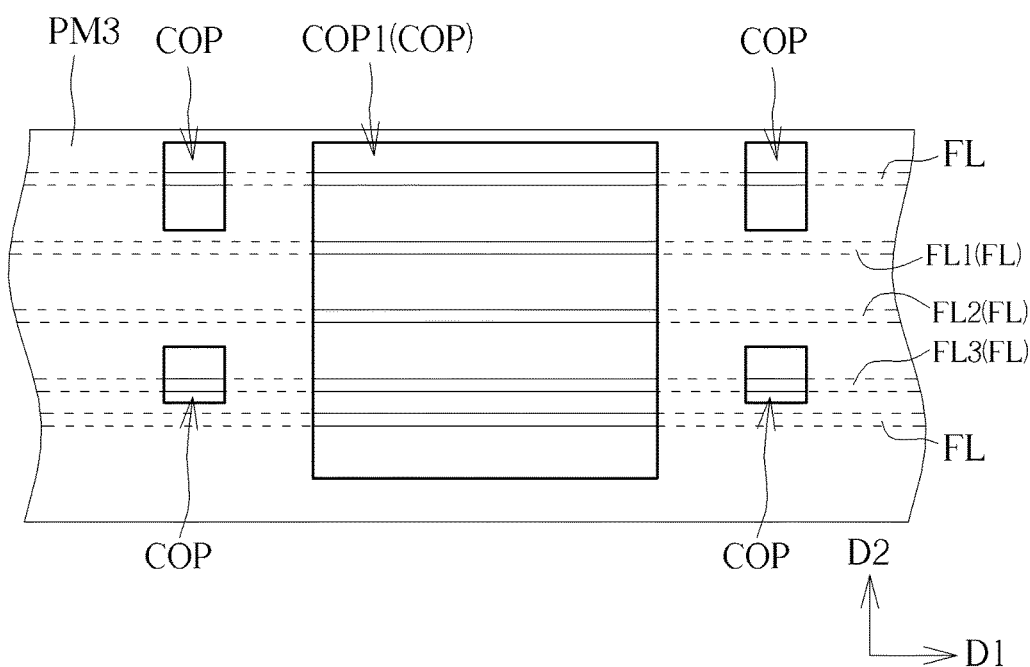
Figure 5:
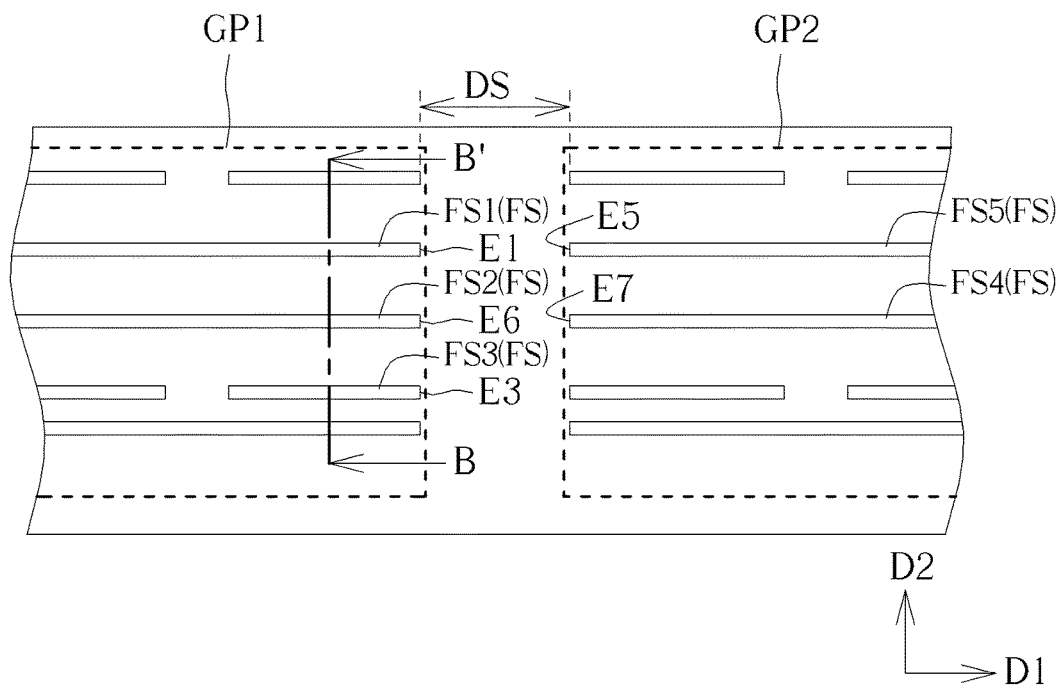
Figure 6:
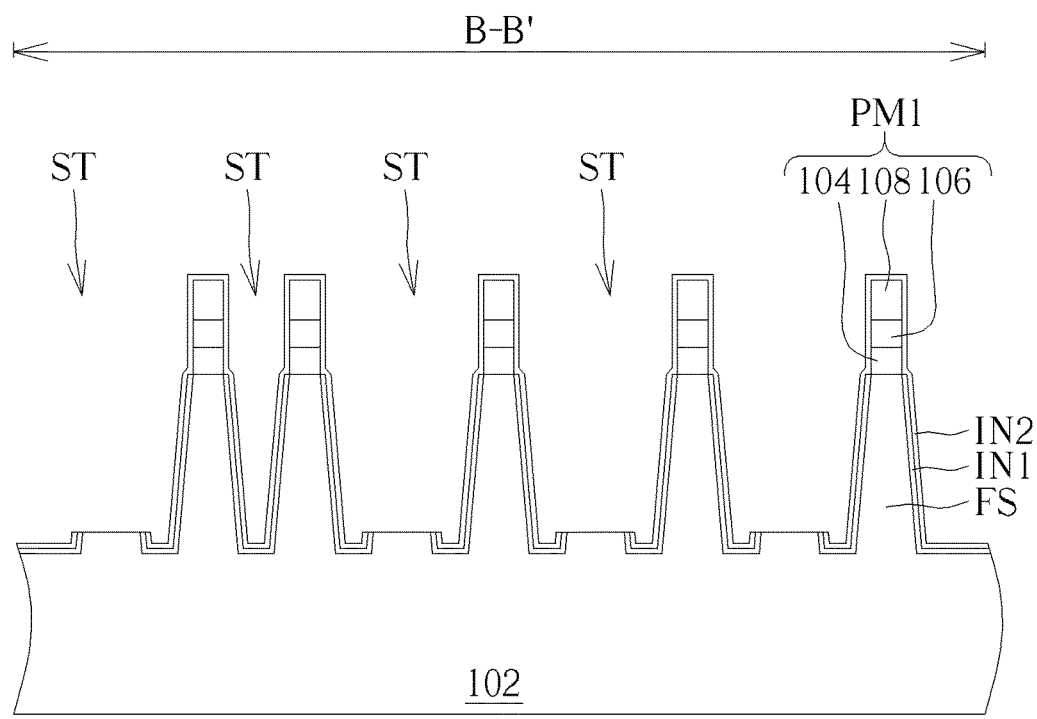
Figure 9:
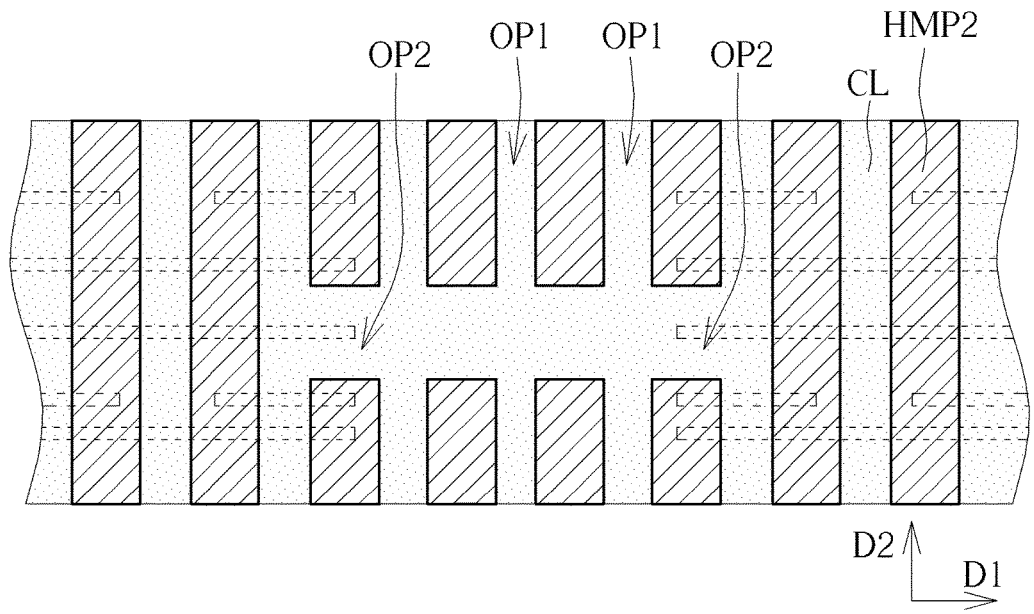
Figure 10:
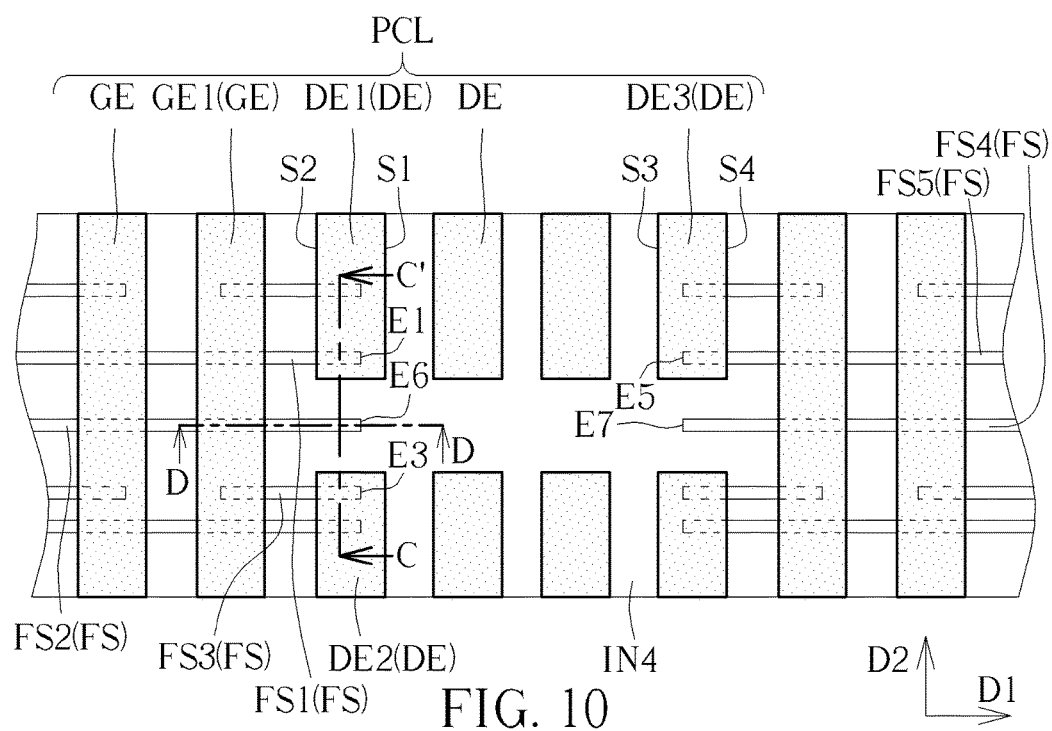
Figure 11:
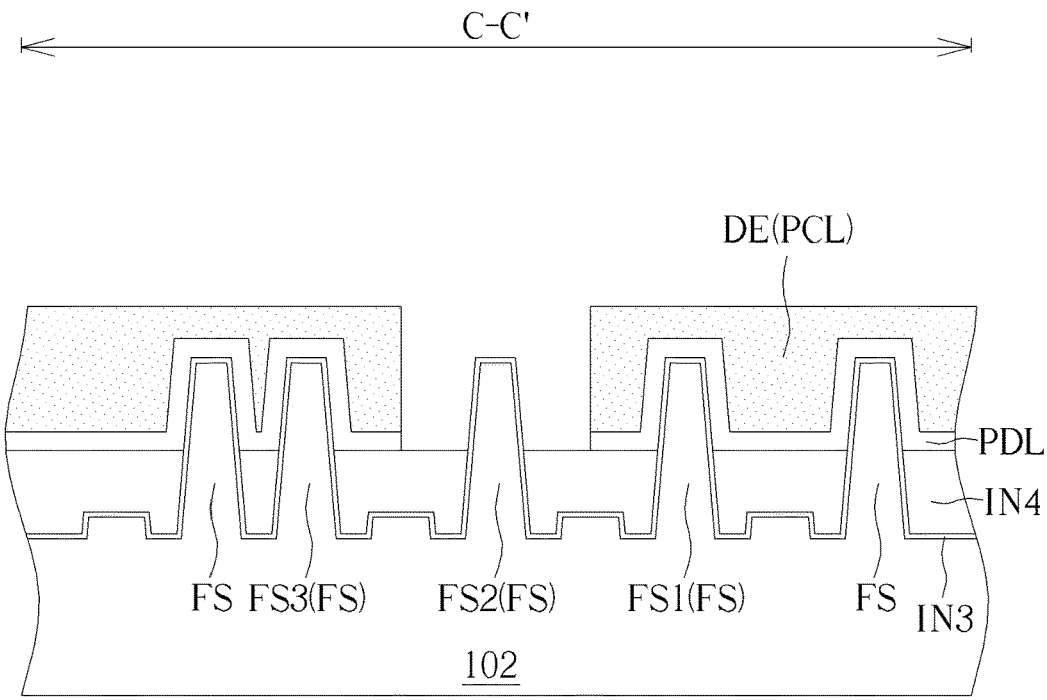
Figure 12:
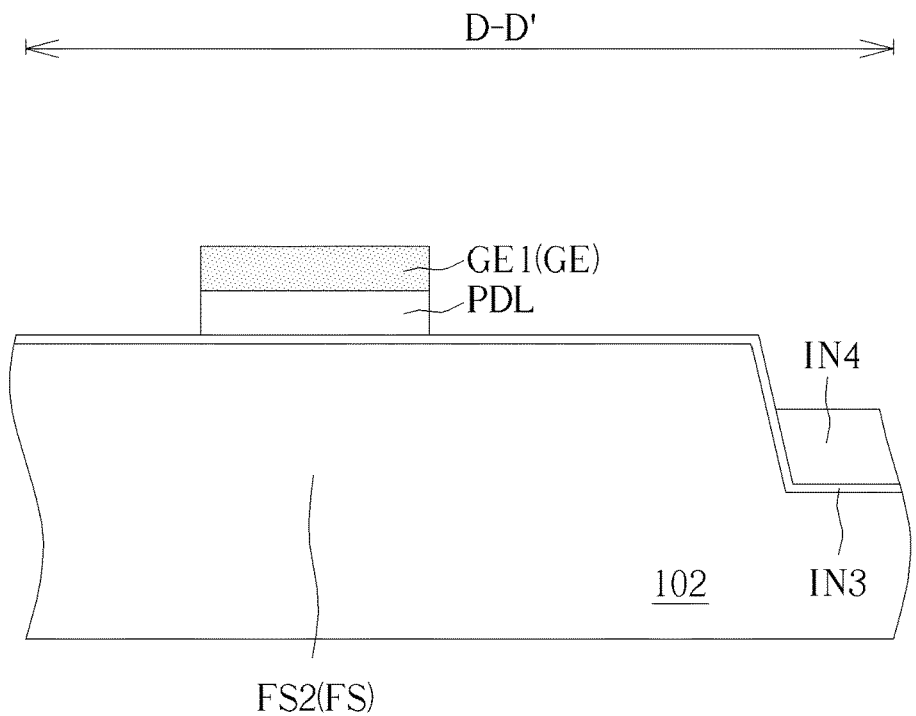
Figure 13:
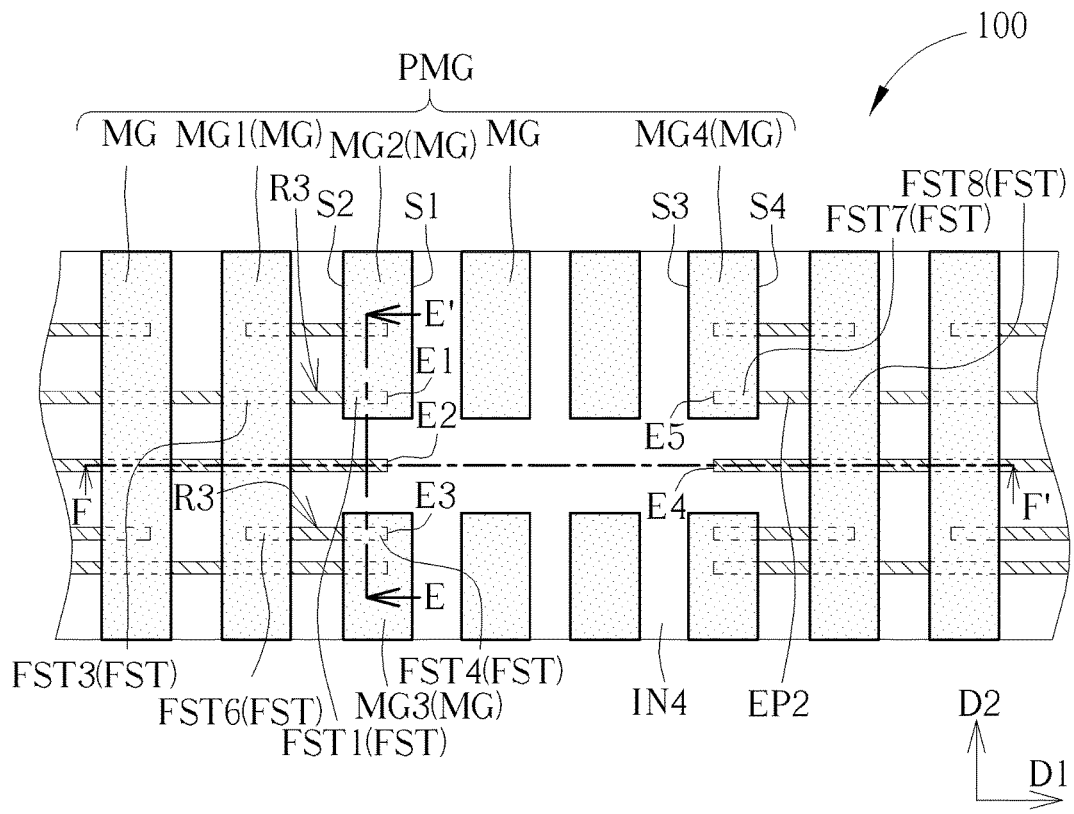
Figure 14:
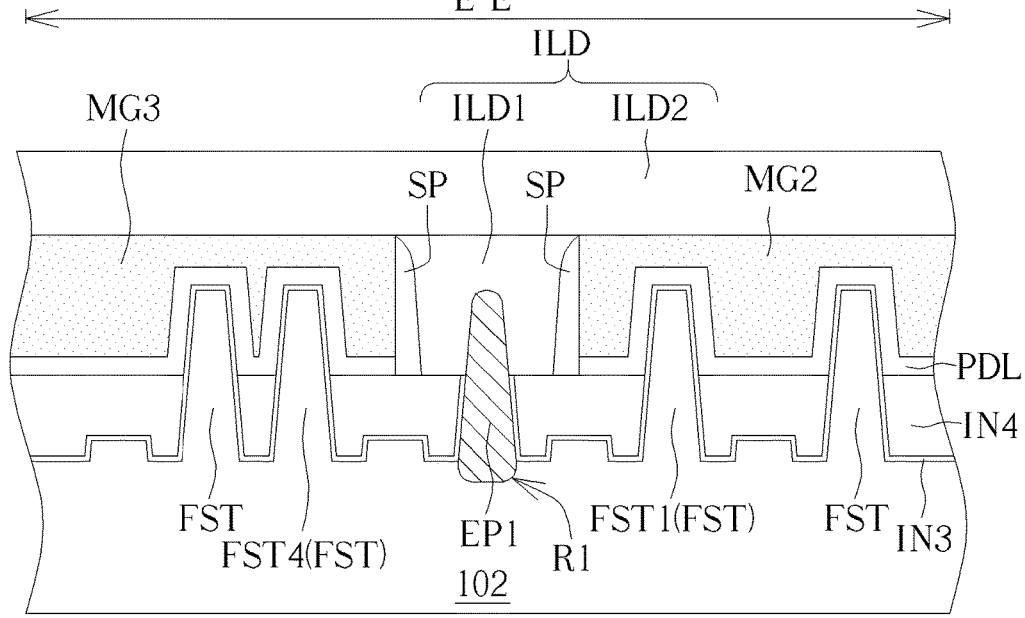
Figure 15:
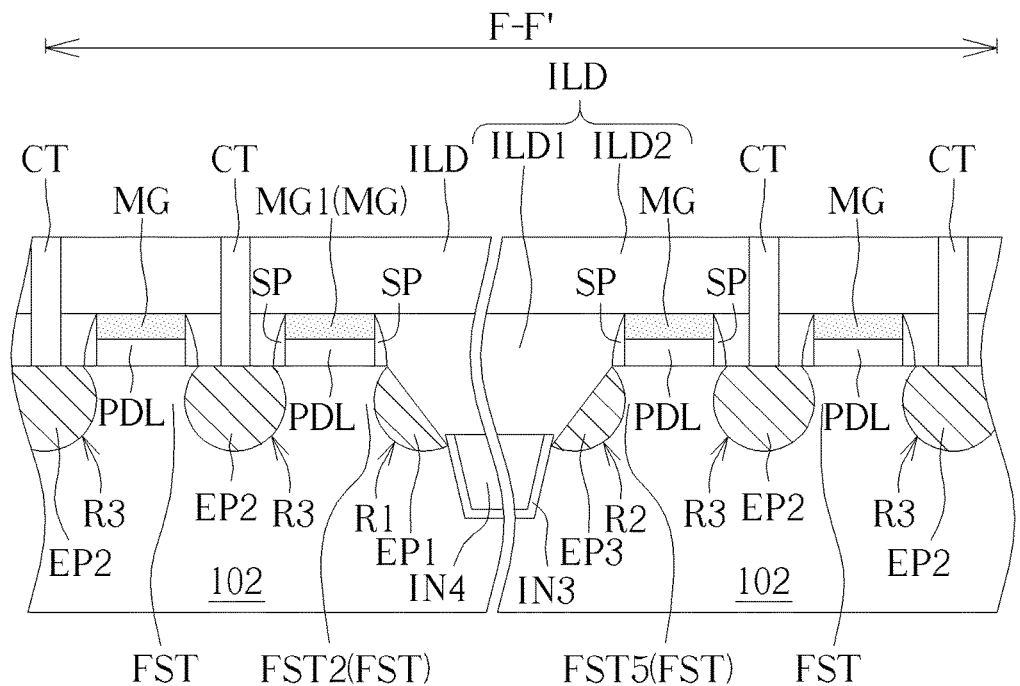

Please refer to FIG. 1 to FIG. 15, which are schematic drawings of a manufacturing method of a semiconductor device according to an embodiment of the present invention, in which FIG. 2 is a schematic diagram of a cross-sectional view taken along a cross-sectional line A-A' in FIG. 1, FIG. 6 is a schematic diagram of a cross-sectional view taken along the cross-sectional line B-B' in FIG. 5, FIG. 11 is a schematic diagram of a cross-sectional view taken along the cross-sectional line C-C' in FIG. 10, FIG. 12 is a schematic diagram of a cross-sectional view taken along the cross-sectional line D-D' in FIG. 10, FIG. 13 is a schematic drawing of a top view of the semiconductor device according to the embodiment of the present invention, FIG. 14 is a schematic diagram of a cross-sectional view taken along the cross-sectional line E-E' in FIG. 13, and FIG. 15 is a schematic diagram of a cross-sectional view taken along the cross-sectional line F-F' in FIG. 13. As shown in FIG. 1, a substrate 102 is provided firstly. The substrate 102 may be a semiconductor substrate such as a silicon substrate, a silicon-containing substrate or a silicon-on-insulator (SOI) substrate, but the present invention not limited thereto. The substrate 102 may include a plurality of fin lines FL respectively protruding from a top surface of the substrate 102, wherein each of the fin lines FL respectively extend along a first direction D1, and the fin lines FL are arranged along a second direction D2. The fin lines FL may be formed on the top surface of the substrate 102 by such as a self-aligned double patterning (SADP) method. For example, in the method of forming the fin lines FL, a plurality of patterned sacrificial layers (not shown in figures) may be formed on the substrate 102 by a photolithography etching process and followed by a deposition and etching process performed in sequence, such that a sacrificial spacer is formed on side walls of each of the patterned sacrificial layers. Next, the patterned sacrificial layers are removed. Then, an etching process is performed, such that the pattern of the sacrificial spacers is transferred to the first patterned mask PM1 which is single-layer or multi-layer structure. Thereafter, through another etching process, the pattern of the first patterned mask PM1 is transferred to the lower substrate 102, so as to form a plurality of shallow trenches ST and define each of the fin lines FL at the same time, but the present invention not limited thereto. The first patterned mask PM1 may for example include a multi-layer structure formed of a silicon oxide layer 104, a silicon nitride layer 106 and a silicon oxide layer 108, but not limited thereto.

In this embodiment, after forming each of the fin lines FL, a first insulation layer IN1 may be selectively formed on the surface of the substrate 102 which is not covered by the first patterned mask PM1, that is, the first insulation layer IN1 is formed on a sidewall and a bottom of each of the shallow trenches ST. The forming method of the first insulation layer IN1 may for example include a thermal oxidation process utilizing an in situ steam generation (ISSG), and the first insulation layer IN1 may include silicon oxide or other dielectric materials, but not limited thereto. In another embodiment, the first insulation layer IN1 may be formed by an atomic layer deposition (ALD) process. In still another embodiment, the first patterned mask PM1 may be removed before forming the first insulation layer IN1, such that the first insulation layer IN1 is not only formed on the sidewall and the bottom of each of the shallow trenches ST but also formed on the top surface of each of the fin lines FL.

Moreover, after forming the first insulation layer IN1, a deposition process may be performed selectively, such that a second insulation layer IN2 entirely and conformally covers the first patterned mask PM1 and the first insulation layer IN1, but the present invention not limited thereto. In another embodiment, after the fin lines FL is formed, the first insulation layer IN1 and the second insulation layer IN2 may not be formed.

After forming the second insulation layer IN2 or the fin lines FL, the fin line cutting process is performed for cutting each of the fin lines FL, so as to form a plurality of fin segments FS. In this embodiment, the fin line cutting process may include a first cutting process and a second cutting process, but not limited thereto. The first cutting process is utilized for removing the unwanted fin lines FL which extend along the first direction D1, and the second cutting process is utilized for cutting the fin lines FL or removing n unwanted portions of each of the fin lines FL.

Figure 3:
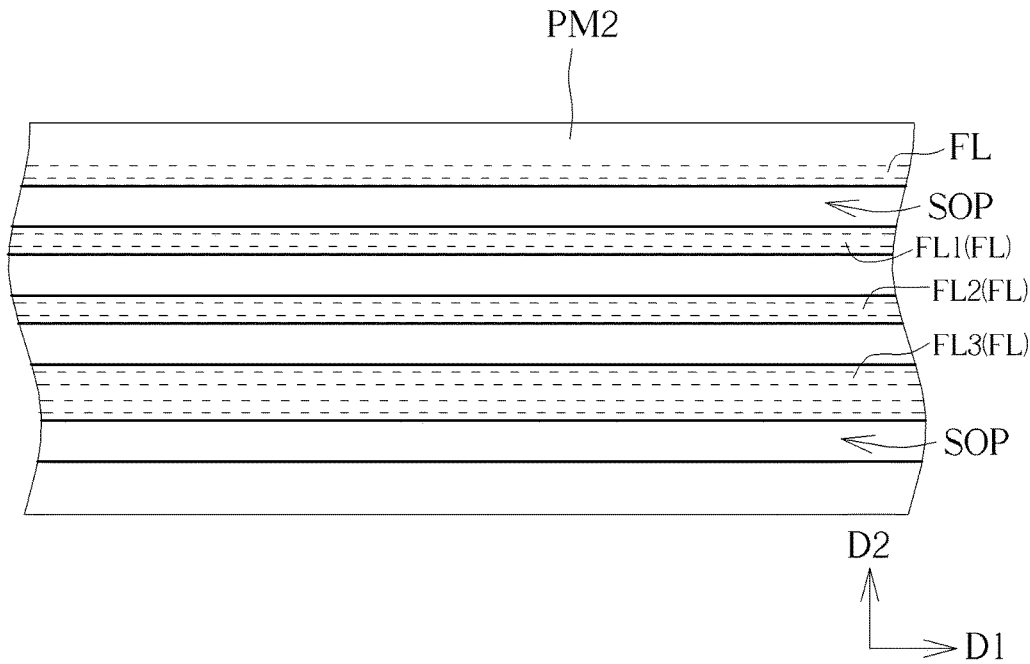

Specifically, as shown in FIG. 3, after forming the second insulation layer IN2 or the fin lines FL, the first cutting process is performed, so as to remove unwanted fin lines FL among the fin lines FL. In the first cutting process, a second patterned mask PM2 may be formed on the second insulation layer IN2 prior, and the second patterned mask PM2 has a plurality of strip openings SOP respectively extending along the first direction D1. Then, another etching process is performed to remove each of the exposed fin lines FL. The remaining fin lines FL may at least include a first fin line FL1 and a second fin line FL2. In this embodiment, the remaining fin lines FL may further include a third fin line FL3, and the second fin line FL2 is disposed between the first fin line FL1 and the third fin line FL3. In other words, the second fin line FL2 is not the outmost fin line FL, but the present invention not limited thereto. Preferably, the second fin line FL2 may be a central fin line FL of the fin lines FL, that is to say, the second fin line FL2 may be the fin line FL farthest from the outmost fin lines FL. In this embodiment, each of the strip openings SOP may expose one of the fin lines FL, but not limited thereto. In another embodiment, each of the strip openings SOP may expose at least two of the adjacent fin lines FL.

As shown in FIG. 4, after the first cutting process, the second patterned mask PM2 is removed. Then, the second cutting process is performed to cut the remaining fin lines FL. Specifically, in the second cutting process, a third patterned mask PM3 may be formed on the remaining fin lines FL, and the third patterned mask PM3 has a plurality of cutting openings COP.

Then, as shown in FIG. 5 and FIG. 6, another etching process is performed for removing the unwanted portion of each of the fin lines FL. That is, each of the fin lines FL is cut to form the fin segments FS, and thereafter, the third patterned mask PM3 is removed. The steps of cutting each of the fin lines FL may cut each of the fin lines FL to form at least one fin segment FS, and the different fin lines FL may be cut through the same cutting openings COP. In this embodiment, the first fin line FL1 may be cut to form a first fin segment FS1 and a fifth fin segment FS5 through one of the cutting openings COP1, the second fin line FL2 may be cut to form a second fin segment FS2 and a fourth fin segment FS4 through this cutting opening COP1, and the third fin line FL3 may be cut to form a third fin segment FS3 and other three fin segments FS through this cutting opening COP1 and other two of the cutting openings COP. Similarly, the other fin lines FL may be cut to form one fin segment FS or a plurality of the fin segments FS through the same cutting opening COP or different cutting openings COP according to requirement. It is noted that since the cutting opening COP1 is disposed across each of the fin lines FL, the fin lines FL may be cut to form the fin segments FS in different groups. For example, the formed fin segments FS may be divided into a first group GP1 and a second group GP2. The first fin segment FS1, the second fin segment FS2 and the third fin segment FS3 may be situated in the first group GP1, and therefore, the third fin segment FS3, the second fin segment FS2 and the first fin segment FS1 may be arranged along the second direction D2. The first fin segment FS1 may have a first end E1, the second fin segment FS2 may have a sixth end E6, the third fin segment FS3 may have a third end E3, and the first end E1, the sixth end E6 and the third end E3 face the first direction D1 and are aligned each other in the second direction D2. The fourth fin segment FS4 and the fifth fin segment FS5 may be situated in the second group GP2, and therefore, the fourth fin segment FS4 and the fifth fin segment FS5 may be arranged along the second direction D2. The fourth fin segment FS4 may have a seventh end E7, the fifth fin segment FS5 may have a fifth end E5, and the seventh end E7 and the fifth end E5 may face an opposite direction of the first direction D1 and be aligned each other in the second direction D2. The first end E1, the sixth end E6, the third end E3, the seventh end E7 and the fifth end E5 are defined through the same cutting opening COP1. In addition, because the second fin segment FS2 and the fourth fin segment FS4 are formed by cutting the same second fin line FL2, the second fin segment FS2 and the fourth fin segment FS4 may be arranged on a same line, and the seventh end E7 may face the sixth end E6. Furthermore, a space existing between the second fin segment FS2 and the fourth fin segment FS4 is defined through the cutting opening COP1, and thus, no fin segment FS exists between the second fin segment FS2 and the fourth fin segment FS4. Similarly, the first fin segment FS1 and the fifth fin segment FS5 may be arranged on a same line, and the fifth end E5 may face the first end E1. In this embodiment, a width of the cutting opening COP1 in the first direction D1 may greater than about 70 nanometers (nm), or microns even, and therefore, a space DS may exist between the sixth end E6 and the seventh end E7, which may be greater than 70 nm, or microns even. Similarly, a space existing between the first end E1 and the fifth end E5 may be greater than 70 nm, or microns even.

In another embodiment, the order of the first cutting process and the second cutting process may be exchanged. That is to say, each of the fin lines FL is cut to form the segmented fin segments FS and followed by removing the fin segments FS of the unwanted fin lines FL by the first cutting process. In still another embodiment, the fin line cutting process may include the second cutting process only.

Figure 7:
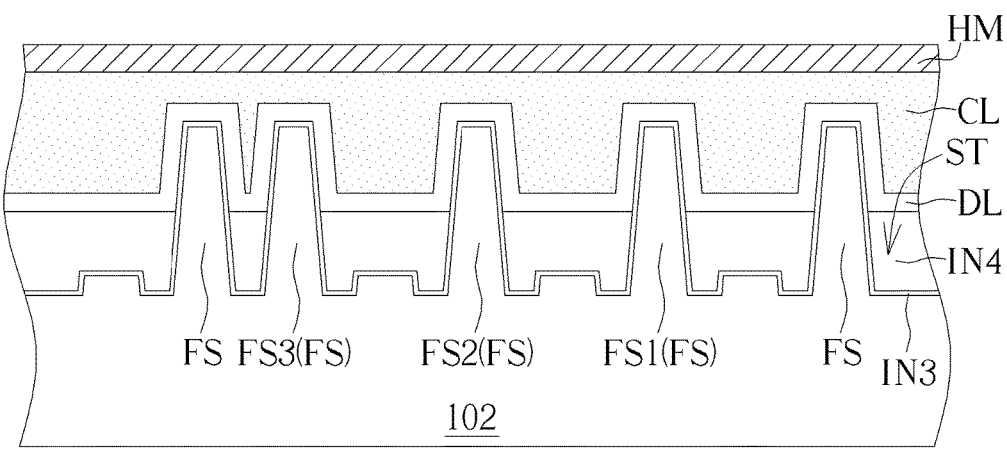

As shown in FIG. 7, after the third patterned mask PM3 is removed, the second insulation layer IN2, the first patterned mask PM1 on each of the fin segments FS and the first insulation layer IN1 may be removed further to expose the top surface of the substrate 102, and thus, the fin segments FS are exposed also. Then, a third insulation layer IN3 is entirely and conformally formed on the substrate 102, such that the third insulation layer IN3 covers the substrate 102 and the fin segments FS. The third insulation layer IN3 may be such as a single-layer or multi-layer structure. For example, the third insulation layer IN3 may include silicon oxide or other high dielectric constant material, and the forming method thereof may be such as the deposition process or the thermal oxidation process utilizing the ISSG to be conformally formed on the surfaces of the fin segments FS and the shallow trenches ST. Next, an insulating material layer is formed on the third insulation layer IN3 overall, which is preferably formed by utilizing a flowable chemical vapor deposition (FCVD) process. Thereafter, a fourth insulation layer IN4 is formed in the shallow trenches ST by a chemical mechanical polishing (CMP) process and an etching back process, that is, the fourth insulation layer IN4 is a shallow trench isolation (STI) structure. By controlling the etch time and the etch rate, the etching back process may be performed until a portion of each of the fin segments FS protrudes from the fourth insulation layer IN4, such that a top surface of the fourth insulation layer IN4 is between top surfaces of the fin segments FS and the bottoms of the shallow trenches ST. In another embodiment, the third insulation layer IN3 may not be formed before forming the fourth insulation layer IN4.

Figure 8:
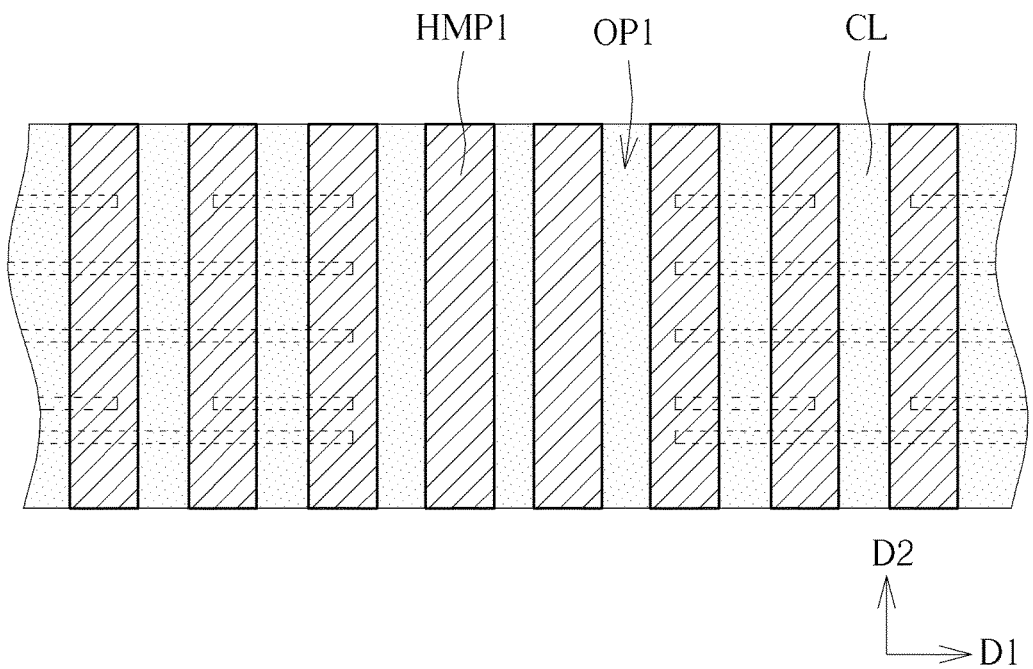
Figure 16:
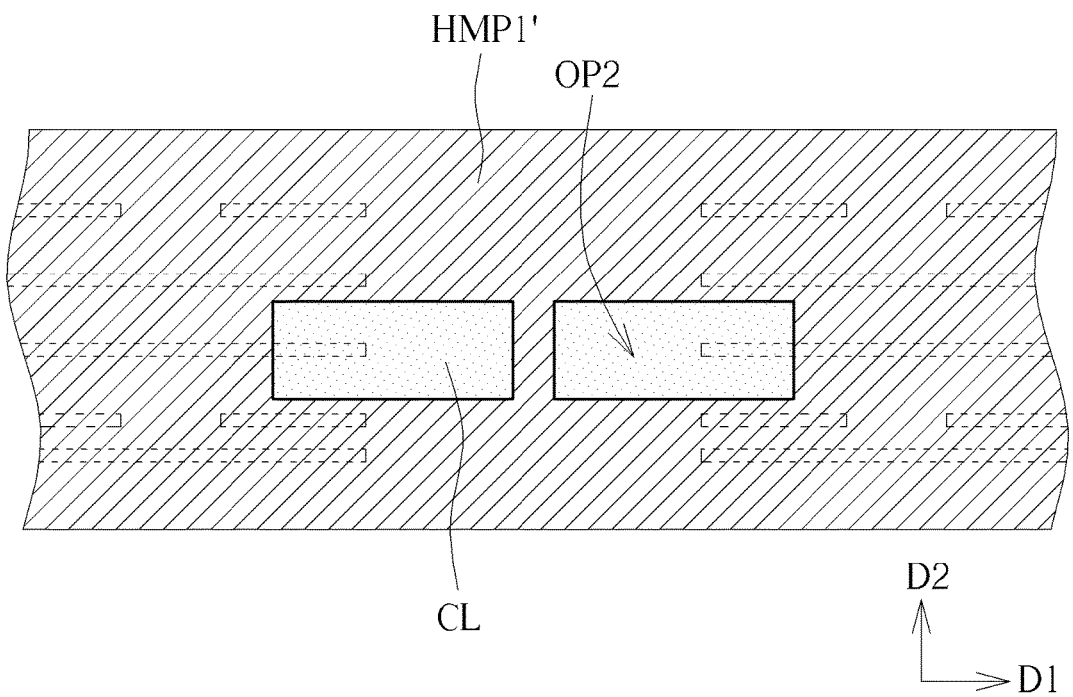
FIG. 16 is a schematic drawing of a method of forming a first hard mask pattern according to another embodiment of the present invention.

After forming the fourth insulation layer IN4, a patterned dielectric layer PDL and a patterned conductive layer PCL are formed on the fourth insulation layer IN4, in which the patterned conductive layer PCL covers the first end E1 of the first fin segment FS1, and the patterned conductive layer PCL does not cover the sixth end E6 of the second fin segment FS2. The steps of forming the patterned conductive layer PCL and the patterned dielectric layer PDL of this embodiment is specifically described below. Firstly, as shown in FIG. 7, a dielectric material layer DL and a conductive layer CL are sequentially formed on and covers each of the fin segments FS and the fourth insulation layer IN4, and then, a hard mask layer HM is formed on the conductive layer CL. Next, as shown in FIG. 8, a first photolithography etching process is performed for patterning the hard mask layer HM, so as to form a first hard mask pattern HMP1. In this embodiment, the first hard mask pattern HMP1 may have a plurality of first openings OP1 extending along the second direction D2 respectively, but not limited thereto. In other words, the first photolithography etching process may be utilized for defining the positions of dummy gates, and particularly the positions in the first direction D1. Thereafter, as shown in FIG. 9, a second photolithography etching process is performed for patterning the first hard mask pattern HMP1, so as to form a second hard mask pattern HMP2. In this embodiment, at least one second opening OP2 is formed in the second hard mask pattern HMP2, and the second opening OP2 exposes the conductive layer CL situated directly above the sixth end E6. Specifically, the second hard mask pattern HMP2 may have two second openings OP2, and the second openings OP2 respectively expose the opposite ends of the different fin segments FS which correspond to the same fin line FL and are situated in the different groups, for example, the conductive layer CL situated directly above the sixth end E6 of the second fin segment FS2 and the conductive layer CL situated directly above the seventh end E7 of the fourth fin segment FS are exposed, but not limited thereto. In other words, the second photolithography etching process may be utilized for defining a portion of the dummy gates wanted to be removed and the end of the fin segments FS wanted to be exposed. In another embodiment, as shown in FIG. 16, the order of the first photolithography etching process and the second photolithography etching process may be exchanged, that is to say, forming the first hard mask pattern HMP1' may include forming the second openings OP2 exposing the conductive layer CL situated directly above the sixth end E6 and the seventh end E7 in the hard mask layer HM, and forming the second hard mask pattern HMP2 is to form the first openings OP1 in the first hard mask pattern HMP1'.

Subsequently, as shown in FIG. 10 to FIG. 12, the second hard mask pattern HMP2 is transferred to the conductive layer CL, so as to form the patterned conductive layer PCL on the third insulation layer IN3 and expose at least the sixth end E6 of the second fin segment FS2. Next, the second hard mask pattern HMP2 is removed. In this embodiment, the step of transferring the second hard mask pattern HMP2 to the conductive layer CL may also transfer the pattern of the second hard mask pattern HMP2 to the dielectric material layer DL, so as to form the patterned dielectric layer PDL. Accordingly, the patterned dielectric layer PDL may have a pattern the same as the pattern of the patterned conductive layer PCL and is used as a gate dielectric layer, but not limited thereto. Moreover, the step of forming the patterned conductive layer PCL may also expose the seventh end E7 of the fourth fin segment FS4. In another embodiment, the method of forming the patterned conductive layer PCL may directly pattern the conductive layer CL by the first photolithography etching process or the second photolithography etching process, so as to form a conductive pattern. Then, the conductive pattern is patterned by the second photolithography etching process or the first photolithography etching process to form the patterned conductive layer PCL.

In this embodiment, the patterned conductive layer PCL may include a plurality of the dummy gates. The dummy gates may include a plurality of first dummy gates GE and a plurality of second dummy gates DE. Each of the first dummy gates GE may be disposed across at least one of the fin segments FS, and the second dummy gates DE cover the end of at least one of the fin segments FS. For example, one first dummy gate GE1 may be disposed across the first fin segment FS1 and the second fin segment FS2. The first dummy gate GE1 may also cover the end of the third fin segment FS3 opposite to the third end. Through the definition of the second openings OP2, one second dummy gate DE1 may cover the first end E1 of the first fin segment FS1, and another second dummy gate DE2 arranged with the second dummy gate DE1 in the second direction D2 may cover the third end E3 of the third fin segment FS3. The width of each of the first dummy gates GE and the width of each of the second dummy gates DE in the first direction D1 may be such as 30 nm respectively, but not limited thereto. In another embodiment, each of the second dummy gates DE may extend across the other fin segments FS.

It is worth to note that the conductive layer CL situated directly above the sixth end E6 and the seventh end E7 is removed through the second openings OP2 formed by the second photolithography etching process, such that the patterned conductive layer PCL does not cover the sixth end E6 and the seventh end E7, that is, the sixth end E6 of the second fin segment FS2 and the seventh end E7 of the fourth fin segment FS4 may be exposed after forming the patterned conductive layer PCL. Because the relative position between the sixth end E6 and the second dummy gate DE1 in the second direction D2 does not exceed the detecting range of the scanning electron microscope, and the first end E1 and the sixth end E6 are aligned in the second direction D2, the relations between the sixth end E6 and two opposite sides S1, S2 of the second dummy gate DE1 would be detected by the scanning electron microscope directly after patterning the conductive layer CL, that is, performing an after etching inspection (AEI). Accordingly, the position accuracy of the sixth end E6 formed through the cutting opening COP1 and the position accuracy of the second dummy gate DE1 formed by the first photolithography etching process can be measured, thereby immediately confirming whether the relative position between the sixth end E6 and the projection of the second dummy gate DE1 projected on the first direction D1 accords with the requirement or not. Furthermore, the method of inspecting the accuracy of the second cutting process and the second photolithography etching process may further utilize the scanning electron microscope to detect the relations between the seventh end E7 arranged on the same line as the sixth end E6 and two opposite sides S3, S4 of the second dummy gate DE3, and the two opposite sides S3, S4 are opposite in the first direction D1. Because the scanning electron microscope can immediately perform detection after the patterned conductive layer PCL is formed, the alignment deviation of the mask pattern formed by the first photolithography etching process and the alignment deviation of the cutting opening COP1 may be measured by detecting the relation described above, so as to improve and adjust process parameters of other circuit units manufactured in subsequent processes and to decrease the incidence rate of the first end E1 of the first fin segment FS1 without being covered by the second dummy gate DE1. For example, when the second fin segment FS2 and the second dummy gate DE1 does not overlap in the second direction D2, the cutting openings COP1 is judged to excessively cut the second fin line FL2. When the second fin segment FS2 and the second dummy gate DE1 overlap in the second direction D2 and the sixth end E6 protrudes from the side S1 of the second dummy gate DE1, the cutting openings COP1 is judged to cut the second fin line FL2 too little. Furthermore, the judgement may be assisted by detecting the relative position between the fourth fin segment FS4 and the second dummy gate DE2. Moreover, because the end of the outer fin segments FS is easy to round when forming the fin segments FS, the deviation of the relative position between the rounded end and the second dummy gates DE is greater, so as not to accurately judge the alignment relation between the mask pattern formed by the first photolithography etching process and the cutting opening COP1 through the relative position. So, the second fin segment FS2 having the exposed sixth end E6 is preferably formed by cutting the second fin line FL2 situated in the center of the fin lines FL, but not limited thereto. In still another embodiment, in the first group GP1, the number of the fin segments FS having the exposed end may also be two, or more.

As shown in FIG. 13 to FIG. 15, after forming the patterned dielectric layer PDL, a spacer SP is formed on a sidewall of each of the first dummy gates GE and a sidewall of each of the second dummy gates DE respectively. Then, the exposed third insulation layer IN3 is removed by using the patterned conductive layer PCL and the spacers SP as a mask, so as to expose each of the fin segments FS. Next, each of the exposed fin segments FS is etched to form a plurality of recesses in each of the exposed fin segments FS and also form a plurality of fin structures FST extending along the first direction D1. In this embodiment, the recesses may include a first recess R1 and a plurality of third recesses R3. The first recess R1 is formed by removing the exposed second fin segment FS2 which has the sixth end E6, and the third recesses R3 are formed by removing the fin segments FS situated between two adjacent first dummy gates GE or situated between one of the first dummy gates GE and one of the second dummy gates DE adjacent to each other. Since a depth of each recess is greater than a height of each fin segment FS, the recesses may divide the fin segments FS into the fin structures FST, and the fin structures FST are disposed right under the patterned conductive layer PCL and the spacers SP. For example, a part of the first fin segment FS1 may be divided into a first fin structure FST1 and a third fin structure FST3 by one of the recesses R3 between the first fin structure FST1 and the third fin structure FST3. Another one of the recesses R3 and the first recess R1 may divide a part of the second fin segment FS2 into a second fin structure FST2 between this recess R3 and the first recess R1. The third fin segment FS3 is divided into a fourth fin structure FST4 and a sixth fin structure FST6 by another one of the recesses R3 between the fourth fin structure FST4 and the sixth fin structure FST6. The third fin structure FST3 and the first fin structure FST1 are aligned along the first direction D1, and the second fin structure and the third fin structure are arranged along the second direction D2. The first fin structure FST1 has the first end E1 facing the first direction D1. The recesses may selectively further include a second recess R2 formed by removing the exposed fourth fin segment FS4 which has the seventh end E7, and another one of the recesses R3 and the second recess R2 may divide a part of the fourth fin segment FS4 into a fifth fin structure FST5 between this recess R3 and the second recess R2. The first recess R1 and the second recess R2 are symmetrical to each other with respect to the second direction D2. Since the first recess R1 and the second recess R2 are formed by removing the second fin segment FS2 and the fourth fin segment FS4, the space DS may exist between the first recess R1 and the second recess R2, which may be greater than 70 nm.

After forming the recesses, an epitaxial process is performed for forming an epitaxial layer in each of the recesses respectively. In this embodiment, each of the epitaxial layers may include a silicon germanium epitaxial layer, and each of the epitaxial layers may be a single-layer structure or a multi-layer structure, but not limited thereto. It is worth to note that the epitaxial layers may include a first epitaxial layer EP1 and a plurality of second epitaxial layers EP2. The first epitaxial layer EP1 is formed in the first recess R1 and at a side of the second fin structure FST2, and each of the second epitaxial layers EP2 is formed in corresponding one of the third recesses R3 respectively. It is worth to note that the first epitaxial layer EP1 corresponds to a part of the second fin structure FS2 having the sixth end E6, so the first epitaxial layer EP1 may have a second end E2 facing the first direction D1 the same as the first end E1. One of the second epitaxial layers EP2 is disposed between the first fin structure FST1 and the third fin structure FST3, and a length of the first epitaxial layer EP1 in the first direction D1 is greater than a length of this second epitaxial layers EP2 in the first direction D1. Furthermore, the second end E2 may overlap the second dummy gate DE1 in the second direction D2 and may not be covered by the patterned conductive layer PCL. In this embodiment, the epitaxial layers may further selectively include a third epitaxial layer EP3 formed in the second recess R2 and at a side of the fifth fin structure FST5 facing the second fin structure FST2. Because the third epitaxial layer EP2 corresponds a part of the fourth fin segment FS4 having the seventh end E7, the third epitaxial layer EP3 may have a fourth end E4 facing the opposite direction of the first direction D1 the same as the fifth end E5, such that the fourth end E4 faces the second end E2, and a length of the third epitaxial layer EP3 in the first direction D1 is greater than the length of one of the second epitaxial layers EP2 between a seventh fin structure FST7 and an eighth fin structure FST8 in the first direction D1. Furthermore, the third epitaxial layer EP3 may be symmetrical to the first epitaxial layer EP1 with respect to the second direction D2. The fourth end E4 may overlap the second dummy gate DE3 in the second direction D2 and may not be covered by the patterned conductive layer PCL.

After forming the epitaxial layers, the substrate 102 is entirely covered by an interlayer dielectric layer ILD. In this embodiment, the interlayer dielectric layer ILD may at least include a first layer ILD1 that has a top surface substantially leveled with a top surface of each spacer SP, and a second layer ILD2 covering the entire substrate 102. Also, after the first layer ILD1 is formed, the patterned conductive layer PCL may be removed and replaced by a patterned metal gate layer PMG in order to reduce gate resistivity. Since the patterned metal gate layer PMG has the same pattern as the patterned conductive layer PCL, the patterned metal gate layer PMG may include a plurality of metal gates MG corresponding to the first dummy gate GE and the second dummy gate DE respectively. For example, the metal gates MG may include a first metal gate MG1 replacing the first dummy gate GE1, a second metal gate MG2 replacing the second dummy gate DE1, a third metal gate MG3 replacing the third dummy gate DE2 and a fourth metal gate MG4 replacing the second dummy gate DE3. The first metal gate MG1 may be used as a gate of a transistor including the second fin structure FST2 and the third fin structure FST3. Thus, the second end E2 may overlap the second metal gate MG2 and the third metal gate MG3 in the second direction D2, and the fourth end E4 may overlap the fourth metal gate MG4 in the second direction D2. After the patterned metal gate layer PMG is formed, the second layer ILD2 is formed to cover the patterned metal gate layer PMG and the first layer ILD1. Then, a plurality of contact plugs CT are formed in the interlayer dielectric layer ILD, and each of the contact plugs CT is electrically connected to corresponding one of the second epitaxial layers EP2 respectively, so as to form the semiconductor device 100 of this embodiment. Person having ordinary skill in the art should know that other semiconductor manufacturing processes may also be performed to the formed semiconductor device 100, and thus will not be redundantly described. It is worth to note that the first epitaxial layer EP1 and the third epitaxial layer EP3 are not used as source and drain, and therefore, the contact plugs CT are not formed on the first epitaxial layer EP1 and the third epitaxial layer EP3.

The semiconductor device 100 of this embodiment may be a test key pattern utilized for measuring the accuracy of cutting the fin lines FL through the cutting openings COP in the second cutting process and the position accuracy of forming the patterned conductive layer. For example, the semiconductor device 100 may be a part of integrated circuit components, that is to say, other components may be further formed on the substrate 102, but the present invention not limited thereto. In another embodiment, the semiconductor device 100 may be situated in the cutting line between the circuit components, and the semiconductor device 100 may be removed after completing the circuit components. In still another embodiment, the semiconductor device 100 may be a transistor component of the circuit components.

Figure 17:
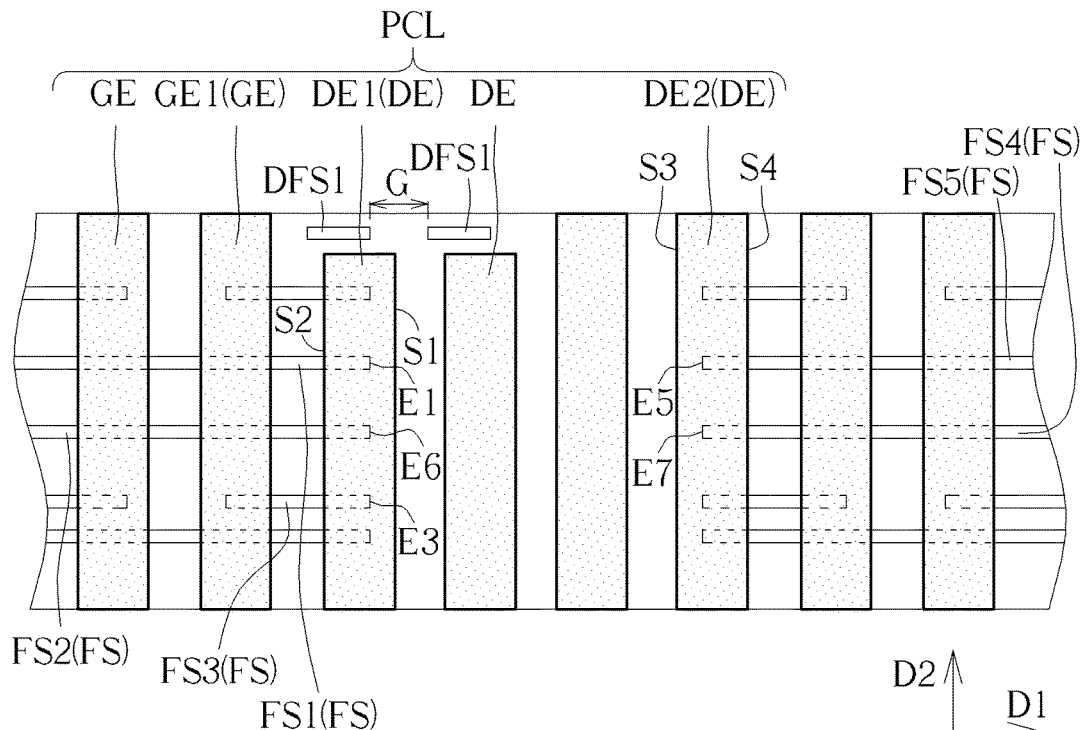
FIG. 17 and FIG. 18 are respectively schematic drawings of a top view of a semiconductor device according to other embodiment of the present invention.
Figure 18:
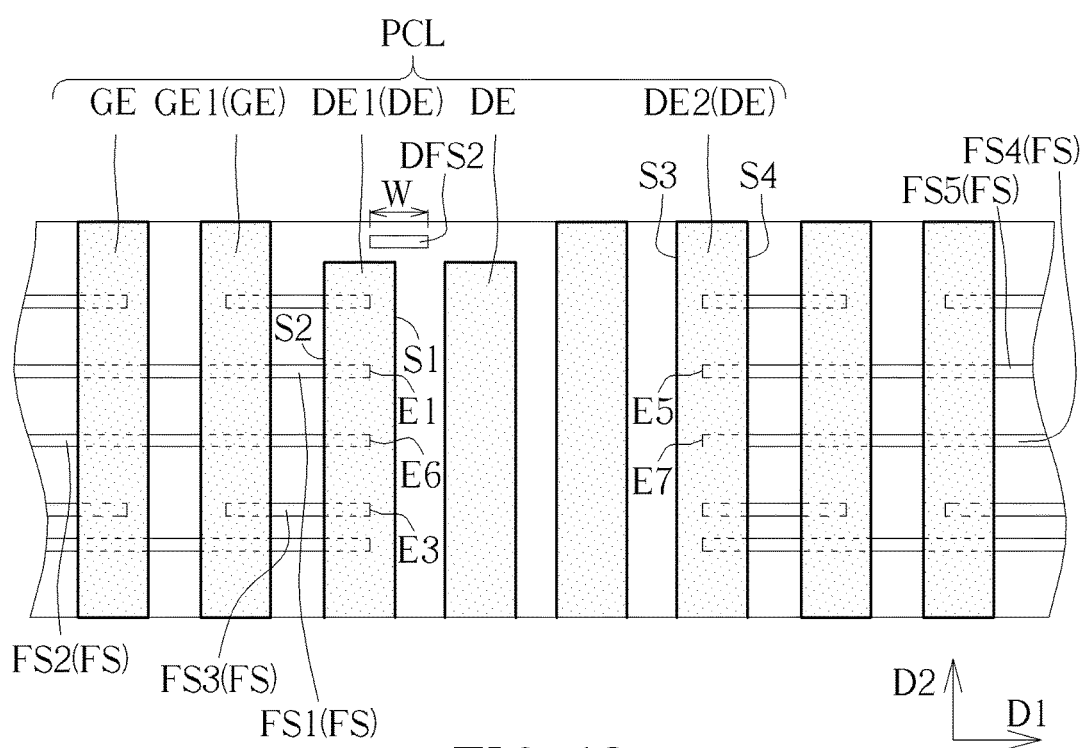

Please refer to FIG. 17 and FIG. 18, which are respectively schematic drawings of a top view of a semiconductor device according to other embodiments of the present invention. As shown in FIG. 17, comparing with the embodiment described above, at least two dummy fin structures DFS1 may be formed in the steps of forming the fin structures in this embodiment, and an end of one of the dummy fin structures DFS1 may be aligned with the first end E1 and the sixth end E6 in the second direction D2 and face the first direction D1. The dummy fin segments DFS1 may be formed by cutting the same one of the fin lines FL, and a gap G existing between two of the dummy fin segments DFS1 is smaller than the space between the second fin segment FS2 and the fourth fin segment FS4. Furthermore, the dummy fin segments DFS1 may be exposed in the steps of forming the patterned conductive layer PCL. Because the gap G may be smaller than the detecting range of the scanning electron microscope, the gap G may be measured by the scanning electron microscope directly after patterning the conductive layer CL. And, the gap G may have a predetermined size, and therefore the gap G may be a reference dimension utilized for measuring the relative position between the sixth end E6 and the dummy gate DE1 in the second direction D2. Thereby, in the case of the end of the fin segments FS covered by the patterned conductive layer PCL, the alignment deviation of the mask pattern formed by the first photolithography etching process and the alignment deviation of the cutting opening COP1 formed by the second cutting process may be immediately confirmed by measuring the relative positions between the dummy gate DE1 and the ends of the dummy fin segments DFS1. In another embodiment, the sixth end E6 of the second fin segment FS2 and the seventh end E7 of the fourth fin segment FS4 may not be covered by the patterned conductive layer PCL. As shown in FIG. 18, comparing with the embodiment described above, a dummy fin segment DFS2 may be formed in the steps of forming the fin segments in this embodiment, and an end of the dummy fin segment DFS2 may be aligned with the first end E1 and the sixth end E6, but face the direction different from the direction which the first end E1 and the sixth end E6 face. The dummy fin segment DFS2 may have a width W and be exposed in the steps of forming the patterned conductive layer PCL. Because the width W may be smaller than the detecting range of the scanning electron microscope, the width W may be measured by the scanning electron microscope directly after patterning the conductive layer CL, so as to be the reference dimension utilized for measuring the relative position between the sixth end E6 and the dummy gate DE1 in the second direction D2. Thereby, in the case of the end of the fin segments FS covered by the patterned conductive layer PCL, the alignment deviation of the mask pattern formed by the first photolithography etching process and the alignment deviation of the cutting opening COP1 formed by the second cutting process may be immediately confirmed by measuring the relative position between the dummy gate DE1 and the end of the dummy fin segment DFS2. In another embodiment, the sixth end E6 of the second fin segment FS2 and the seventh end E7 of the fourth fin segment FS4 may not be covered by the patterned conductive layer PCL.

To summarize, in the manufacturing method of the semiconductor device of the present invention, through exposing the end of one of the fin segments after forming the patterned conductive layer, the relation between the cutting opening utilized for defining this end and the mask pattern formed by the first photolithography etching process utilized for defining the position of the second dummy gate can be detected, such that the probability of manufacturing the defective semiconductor devices can be decreased, so as to decrease the manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate comprising a first fin segment and a second fin segment respectively protruding from a top surface of the substrate, wherein the first fin segment and the second fin segment respectively extend along a first direction and are arranged along a second direction, the first fin segment comprises a first fin structure at an end of the first fin segment, and the second fin segment comprises a first recess at an end of the second fin segment, and the first recess and the first fin structure are arranged along the second direction;
a patterned metal gate layer disposed on the substrate, wherein the patterned metal gate layer covers the first fin structure; and
a first epitaxial layer disposed in the first recess.

2. The semiconductor device according to claim 1, wherein the first recess is not covered by the patterned metal gate layer.

3. The semiconductor device according to claim 1, wherein the second fin segment further comprises a second fin structure adjacent to the first recess.

4. The semiconductor device according to claim 3, wherein the substrate further comprises a fifth fin structure and a second recess, the fifth fin structure protrudes from the top surface of the substrate, the fifth fin structure and the second fin structure are aligned in a line, and the second recess is disposed at an end of the fifth fin structure facing the second fin structure, wherein the patterned metal gate layer does not cover the second recess.

5. The semiconductor device according to claim 4, wherein the first recess and the second recess are symmetrical to each other with respect to the second direction.

6. The semiconductor device according to claim 4, wherein a space exists between the first recess and the second recess, and the space is greater than 70 nanometers and less than or equal to 1 micron.

7. The semiconductor device according to claim 4, wherein no fin structure exists between the second fin structure and the fifth fin structure.

8. The semiconductor device according to claim 1, further comprising a fourth fin structure, and the first recess is disposed between the first fin structure and the fourth fin structure.

9. The semiconductor device according to claim 8, wherein the patterned metal gate layer covers the fourth fin structure.

10. The semiconductor device according to claim 1, wherein the first fin segment further comprises a third fin structure and a third recess between the first fin structure and the third fin structure, and a length of the first recess in the first direction is greater than a length of the third recess in the first direction.

11. The semiconductor device according to claim 1, wherein the patterned metal gate layer comprises a metal gate covering the first fin structure.

* * * * *